United States Patent [19]

Cluff

[11] Patent Number: 5,779,488
[45] Date of Patent: Jul. 14, 1998

[54] SOCKET FOR MOUNTING AN ELECTRICAL COMPONENT TO A BOARD

[75] Inventor: Dean Kaye Cluff, Beaverton, Oreg.

[73] Assignee: Intel Corporation, Santa Clara, Calif.

[21] Appl. No.: 772,223

[22] Filed: Dec. 20, 1996

[51] Int. Cl.[6] .................................................. H01R 9/09
[52] U.S. Cl. .................................................. 439/73
[58] Field of Search .............................. 439/68, 70, 72, 439/73, 331

[56] References Cited

U.S. PATENT DOCUMENTS

| | | | |
|---|---|---|---|
| 3,335,327 | 8/1967 | Damon et al. | 361/767 |
| 4,936,783 | 6/1990 | Petersen | 439/70 |
| 5,219,293 | 6/1993 | Imamura | 439/493 |

*Primary Examiner*—Gary F. Paumen
*Attorney, Agent, or Firm*—Kenyon & Kenyon

[57] ABSTRACT

A non-intrusive socket may be used to mount an electrical component such as a surface mount device (SMD) to a board such as a fabricated motherboard. The socket includes a plurality of legs attachable to and detachable from the board. The socket also includes a body contacting with the electrical component and applying a force to the electrical component such that a plurality of electrical leads of the electrical component directly contact a plurality of electrical contact pads formed on the board.

19 Claims, 5 Drawing Sheets

SOCKET FOR MOUNTING AN ELECTRICAL COMPONENT TO A BOARD

BACKGROUND OF THE INVENTION

The present invention relates to a socket used to mount an electrical component to a fabricated motherboard.

Conventional sockets have provided a way of indirectly contacting the electrical leads (or pins) of the electrical component with electrical contact pads on the motherboard. Typically, with conventional sockets, the electrical leads of the socket are soldiered to the pads on the motherboard. The component is mounted in the socket or soldiered to a device that is inserted into the socket. Since conventional sockets are generally larger than the electrical component, such sockets typically have been used on prototype boards. However, use of a small area on the motherboard is important for production motherboards. Therefore, such conventional sockets which require a large amount of space are not generally used on production boards.

With typical production boards that do not include conventional sockets, when failures occur during production and a certain electrical component is suspected of being a failed component, that component is removed and replaced with another component. The removed component is usually then soldered to another motherboard to determine if the failure relates to the motherboard or the particular component. However, frequent removal of soldiered components from boards and re-soldiering components to boards increases the risk that the component will be damaged or that the contact pads on the board will be damaged.

Other conventional sockets have been used with ball grid array (BGA) electrical components where the socket is attached to the board and the electrical leads slide onto the socket. The socket is used to lock the leads of the ball grid array component onto corresponding connectors of the socket which are connected to pads on the board. However, use of such a socket can introduce capacitance, inductance and resistance between the component and the pads, since the component leads are not in direct contact with the pads. This additional trace length due to such a socket changes the electrical characteristics in the overall circuit in which the component is included.

Conventional sockets which previously have been used to mount components to a relative location on a fabricated motherboard are soldered to the motherboard and can generally only be used one time. Additionally, previous sockets have required a larger space or surface area on the motherboard than the space necessary for the component itself. Specifically, the footprint of a conventional socket extends well beyond the required space for the component on the motherboard and beyond the pads provided on the motherboard. Use of such a conventional socket can also cause interference with surrounding components on the motherboard. Conventional sockets can add capacitance, inductance, and resistance to the circuit being tested. Additionally, conventional sockets for fine-pitched components (e.g., electrical components with 100–208 electrical leads for a quad flat pack) are expensive.

If an attempt is made to use a conventional socket more than once, the socket must be unsoldered from the motherboard and then re-soldered to a different motherboard. The unsoldering and resoldering introduces the likelihood of rendering the socket unusable and can cause problems related to the motherboard.

SUMMARY OF THE INVENTION

The present invention relates to a non-intrusive socket mounting an electrical component such as a surface mount device (SMD) to a board such as a fabricated motherboard. The socket includes a plurality of legs attachable to and detachable from the board. Additionally, the socket includes a body contacting with the electrical component and applying a force to the electrical component such that a plurality of electrical leads of the electrical component directly contact a plurality of electrical contact pads on the board.

DETAILED DESCRIPTION

Figure 1:
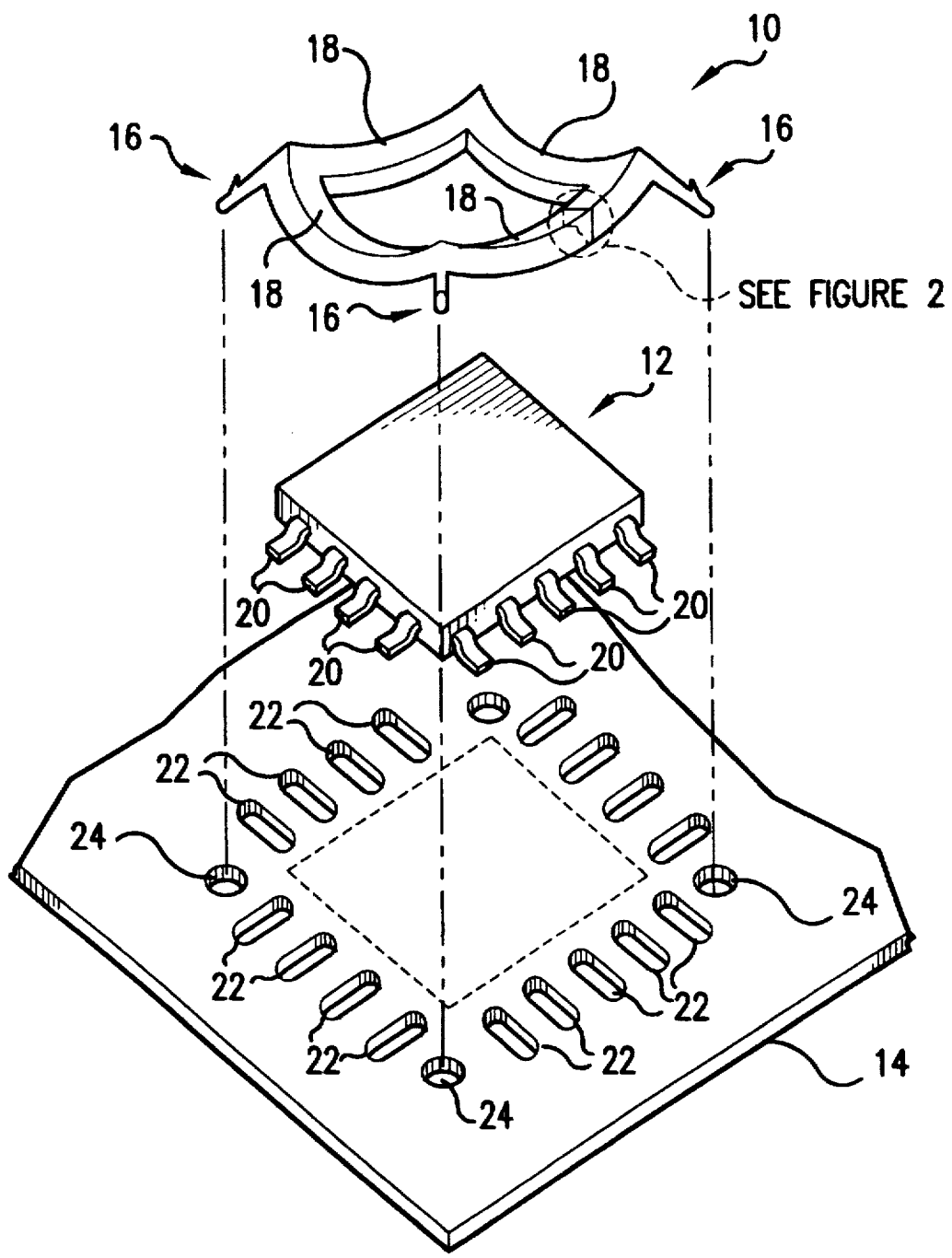
FIG. 1 illustrates in three-dimensional exaggerated view a socket according to an embodiment of the present invention which mounts an electrical component to a board.

FIG. 1 illustrates a socket 10 according to an embodiment of the present invention which mounts an electrical component 12 to a board 14. Socket 10 includes a plurality of legs 16 attachable to and detachable from the board 14. Socket 10 also includes a body 18 contacting with the electrical component 12.

In an embodiment of the present invention, socket 10 is molded from non-conductive high impedance material. The non-conductive high impedance material may be somewhat elastic and non-brittle (e.g., certain plastics, polymers, resins, etc.) The elasticity of the material used for socket 10 may be calculated into the shaping of the socket so that sides of socket 10 are arched in an outward direction of the socket and so that the socket provides a correct force on each electrical lead of electrical component 12.

Electrical component 12 is an electrical component that includes a plurality of electrical leads (or pins) 20. Electrical component 12 may be a surface mount device (SMD) such as a quad flat pack (QFP). In an embodiment of the present invention, electrical component 12 is any component that is required to be coupled to a circuit board.

Board 14 includes a plurality of pads 22 formed thereon which are electrical contact pads. Board 14 additionally includes pre-drilled holes 24 formed therein. Holes 24 may be plated through-holes or nonplated through-holes or any other type of through-hole. In one embodiment of the present invention, board 14 may be a fabricated motherboard. Additionally, board 14 may be a prototype board or a production board.

In one embodiment of the present invention, socket 10 is a non-intrusive SMD socket which is reusable. Electrical component 12 is placed on fabricated motherboard 14 such that electrical leads 20 of electrical component 12 are in direct contact with the pads 22 formed on board 14. Socket 10 is then placed over electrical component 12 such that body 18 of socket 10 comes into contact with edges of electrical component 12 such that socket 10 applies an equal force to each electrical lead 20 of electrical component 12 to electrical contact pads 22 of board 14. As socket 10 is placed over electrical component 12, legs 16 are inserted in through-holes 24 of motherboard 14. Legs 16 are shaped such that they protrude into holes 24 and are locked in place to motherboard 14. Legs 16 extended in an outward direction from socket 10 and include an edge 17 so that socket 10 is locked in place to motherboard 14.

Socket 10 is a reusable socket which may be used to mount fine-pitched components such as QFPs to a relative location on fabricated motherboard 14.

If it becomes necessary to remove electrical component 12 from motherboard 14, socket 10 may be detached from motherboard 14. For example, a user may pinch the tops of legs 16 of socket 10 and pull apart from board 14 to detach socket 10. Then, electrical component 12 may be removed from motherboard 14. A different electrical component 12 may then be placed in position on motherboard 14 and socket 10 may be reused to mount the new electrical component 12 onto motherboard 14 in the same manner. Alternatively, the removed electrical component 12 may be placed on a new motherboard 14 and mounted thereon using socket 10. The reuse of socket 10 does not require any additional soldering or unsoldering, since socket 10 does not require any solder to provide contact between electrical leads 20 and pads 22.

In one embodiment of the present invention, pliable conductive substance is placed on pads 22 to improve the contact between electrical leads 20 and pads 22.

As mentioned above, a socket according to an embodiment of the present invention overcomes the need of soldering the socket to the motherboard. Additionally, the socket is a reusable socket which may be used for multiple motherboard insertions. A socket according to an embodiment of the present invention extends only slightly over the electrical component which is being mounted to the motherboard. This greatly reduces any interference with surrounding electrical components on the motherboard. According to an embodiment of the present invention, the socket applies a uniform force to each electric lead of the electrical component to directly contact the electrical leads with mounting pads on the motherboard. This removes loading problems such as the addition of capacitance, inductance and resistance to the circuit that a conventional socket might induce. The socket according to an embodiment of the present invention also provides a cost effective alternative for testing (e.g., using prototype motherboards).

According to an embodiment of the present invention, a socket may be used to mount electrical components having slightly bent electrical leads (e.g., coplanarity greater than 0.1 mm). In this manner, if any electrical component has previously been used and the electric leads (or pins) have been bent, the electrical component with the bent pins may still be mounted to a motherboard using a socket according to an embodiment of the present invention. This allows testing and further use of an electrical component even though the electrical leads have been bent.

In the embodiment of FIG. 1, the through-holes (or mounting holes) have been pre-drilled in the bare fab of the motherboard during the design phase of a project, for example. In any case, the use of mounting holes 24 allows any motherboard 14 to become a socketed board without requiring any space or surface area near electrical component 12. Therefore, other components near the socketed component are not interfered with. This feature of a socket according to an embodiment of the present invention facilitates debugging analysis of any electrical component on a motherboard without requiring any sort of unsoldering and resoldering process.

According to the present invention, any production motherboard that includes mounting holes 24 can be used to perform component level testing using a non-intrusive reusable socket according to an embodiment of the present invention. This can assist in verifying component failures before a component is returned to the vendor, for example. A socket according to an embodiment of the present invention additionally helps in qualification of new component steppings, and components from new fabrication sites. Additionally, a socket according to an embodiment of the present invention may be used if an electrical component will be changed (e.g., upgrades of the electrical component, etc.). A socket according to an embodiment of the present invention can also help with silicon upgrades or chip set upgrades. Further, a socket according to an embodiment of the present invention may be used in the prototype stage and also for end-user upgrades without requiring a user to send a motherboard (or an entire computer) to a service center.

Although FIG. 1 illustrates an embodiment of the present invention in which the socket mounts a fine pitch component having a Quad Flat Pack_with winged-type electrical leads, other electrical components with other types of leads may be used in implementing the present invention. For example, J-leaded pins (e.g., up to 40 electrical leads) or ball grid array (BGA) lead electrical components or any other components having any other type of leads may be used in implementing the present invention. A socket according to an embodiment of the present invention such as socket 10 of FIG. 1 does not require a particular electrical component with a particular type of electrical lead extending therefrom. As long as body 18 of socket 10 is in contact with edges of electrical component 12 to apply a uniform force to each electrical lead of the electrical component to the pads 22 of board 14, socket 10 can be used to mount any type of electrical component with any type of leads to pads of a board, according to alternative embodiments of the present invention. In this manner, alternative embodiments of the present invention exist in which electrical leads of an electrical component are in good direct contact with pads of the board by providing a uniform pressure to each of the electrical leads.

Additionally, in alternative embodiments of the present invention, different shapes of leg 16 of socket 10 may be used. For example, legs 16 may be shaped in any manner, such that they extend through holes 24 and clip socket 10 in place to supply a correct pressure on electrical leads 20 to pads 22.

In an additional alternative embodiment of the present invention, posts may be mounted on board 14 rather than providing pre-drilled holes 24 in board 14. In such an embodiment of the present invention, legs 16 of socket 10 may be locked to the posts provided on board 14. For example, the legs of the socket may be screwed down onto the posts provided on board 14.

In the embodiment of FIG. 1, socket 10 is preferably molded from a non-conductive, high-impedance anti-static material such as plastic, polymer, resin, etc. However, other alternative embodiments of the present invention may be implemented in which the socket may be formed of or molded from a different type of material. For example, in alternative embodiments of the present invention, a socket may be formed of or molded from any material such that the socket may be used to apply a force to the electrical component such that the electrical leads of the electrical component directly contact the pads formed on the board.

In FIG. 1, through-holes 24 may be plated through-holes, non-plated through-holes or any type of holes which may be beneficial for providing any sort of attachment between legs 16 of socket 10 and holes 24 of board 14.

Figure 2:
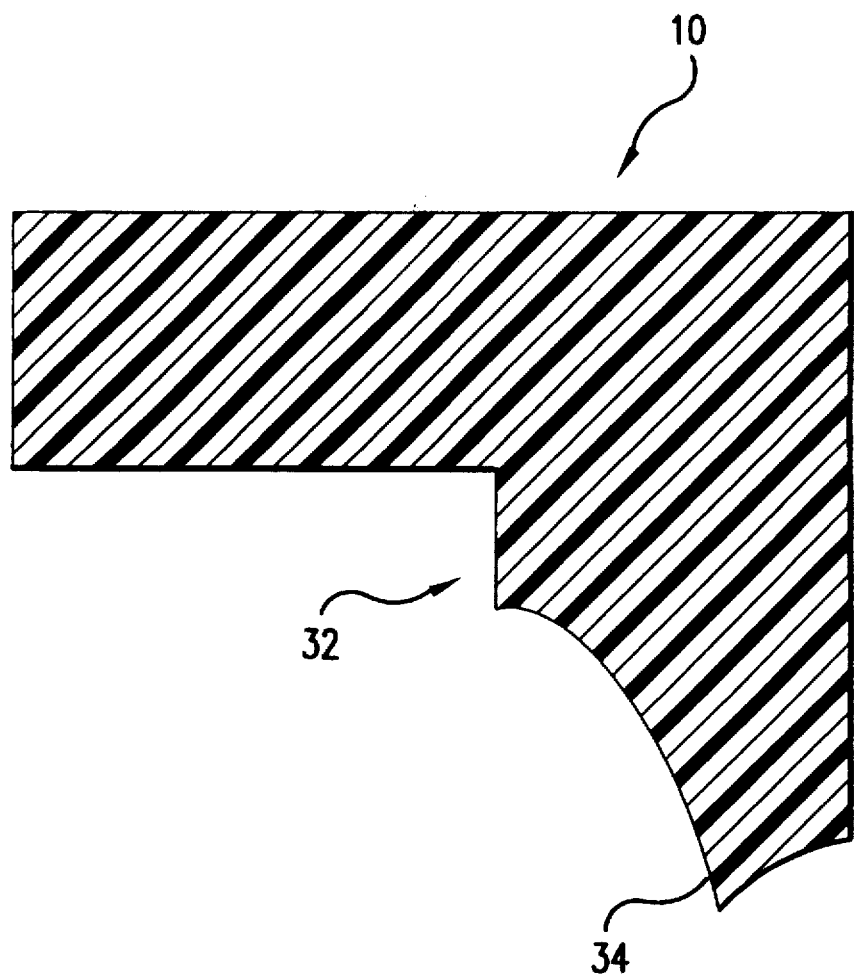
FIG. 2 illustrates a cross-sectional view of a socket according to an embodiment of the present invention.

FIG. 2 illustrates a cross-sectional view of socket 10 of FIG. 1 along the dotted line shown in FIG. 1. Socket 10 includes an inner ridge portion 32 which contacts with electrical component 12. The inner ridge portion 32 of socket 10 additionally includes a bottom portion 34 of the ridge which contacts with the plurality of electrical leads 20 of electrical component 12 to press electrical leads 20 into contact with pads 22 of board 14.

Figure 3:
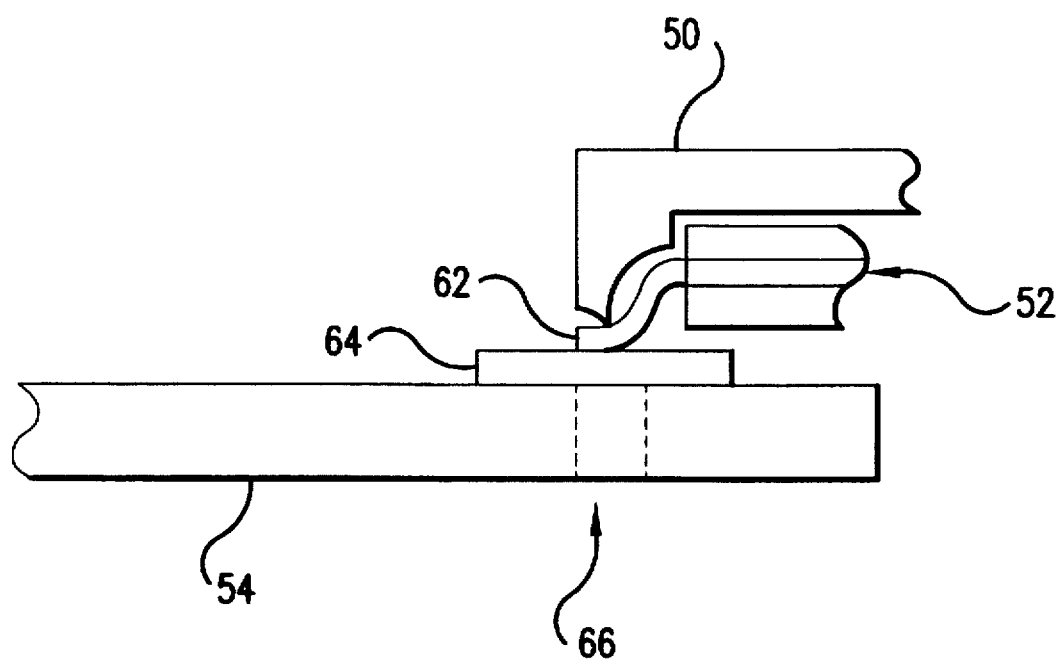
FIG. 3 illustrates an arrangement of a socket according to an embodiment of the present invention which mounts an electrical component to a board.

FIG. 3 illustrates an arrangement of a socket 50 according to another embodiment of the present invention which mounts an electrical component 52 to a board 54. A portion of socket 50 corresponding to the bottom portion 34 of socket 10 as illustrated in FIG. 2 contacts with an electrical lead 62 of electrical component 52 to hold the electrical lead 62 in direct contact with a pad 64 provided on board 54. Board 54 additionally includes a hole 66 (shown in dotted lines in FIG. 3). Socket 50 additionally includes a plurality of legs (not shown in FIG. 3) which are inserted in hole 66 of board 54 in a manner similar to the manner in which legs 16 of socket 10 are inserted into holes 24 of board 14 in the embodiment of FIG. 1.

Figure 4:
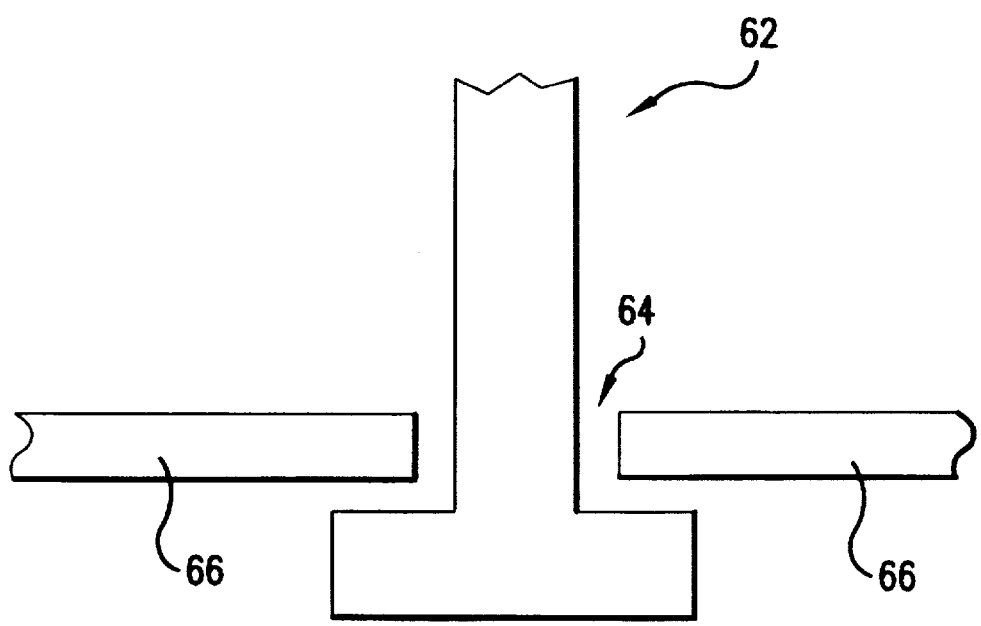
FIG. 4 illustrates an arrangement of a leg of a socket according to an embodiment of the present invention.

FIG. 4 illustrates a leg 62 of a socket according to another embodiment of the present invention. In FIG. 4, leg 62 of a socket similar to socket 10 and socket 50 of FIGS. 1–3 is placed through a hole 64 of a board 66 to attach to board 66 and can be removed from board 66, if necessary.

Figure 5:
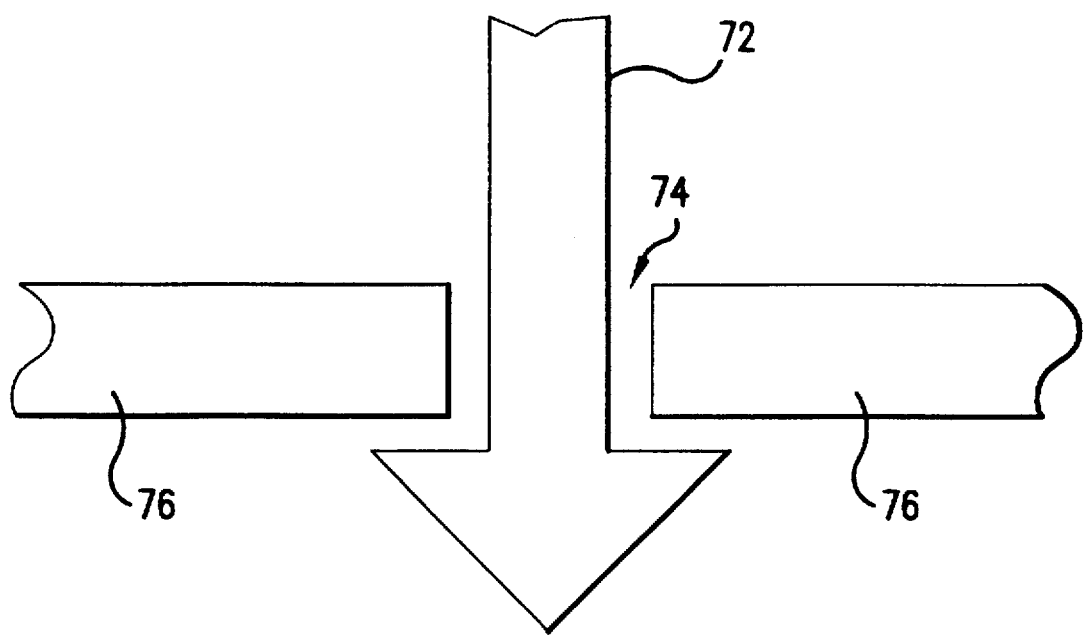
FIG. 5 illustrates an arrangement of a leg of a socket according to an embodiment of the present invention.

FIG. 5 illustrates a leg of a socket according to another embodiment of the present invention. Leg 72 of a socket such as socket 10 or 50 of FIGS. 1–3 is inserted through a hole 74 in board 76 to secure leg 72 to board 76 to attach to board 76 and can be removed from board 76, if necessary.

Although specific embodiments of a leg of a socket according to embodiments of the present invention have been illustrated herein, other socket legs may be used in implementing embodiments of the present invention. Specifically, a socket according to an embodiment of the present invention may include any leg which is attachable to and detachable from a board such that a body of the socket contacts with an electrical component and applies a force to the electrical component such that a plurality of electrical leads of the electrical component directly contact a plurality of pads formed on the board. In an additional alternative embodiment of the present invention, legs of a socket may be attached to a post formed on a board (in place of holes in the board). The legs may be attached to the post formed on the board, for example, by screwing the legs to the post on the board. Additional embodiments of the present invention may not require legs as illustrated herein, but could include any other sort of device for attaching and/or detaching the socket to and/or from the board.

Although embodiments are specifically illustrated and described herein, it will be appreciated that modifications and variations of the present invention are covered by the above teachings and within the purview of the appended claims without departing from the spirit and intended scope of the invention.

What is claimed is:

1. A socket for mounting an electrical component having a plurality of electrical leads to a board, comprising:

a continuous body forming four corners, said body contacting with the electrical component and applying a force to the electrical component such that the plurality of electrical leads directly contact a plurality of pads formed on the boards; and a plurality of legs, each leg coupled to one of said four corners, said legs attachable to and detachable from the board; and wherein said body is initially arched in an outward direction and subsequently is flattened upon the legs being attached to the board.

2. A socket according to claim 1, wherein said socket is a non-intrusive socket.

3. A socket according to claim 1, wherein said board is a fabricated motherboard.

4. A socket according to claim 1, wherein said body applies a force to the electrical component such that a uniform force is applied to each of said plurality of electrical leads.

5. A socket according to claim 1, wherein the plurality of legs are attached to the board through a plurality of holes formed in the board.

6. A socket according to claim 5, wherein the plurality of legs respectively extend through the plurality of holes formed in the board and include a portion which attaches to the board.

7. A socket according to claim 1, wherein the plurality of legs are respectively attached to the board using a plurality of posts provided on the board and wherein said legs are mounted to said posts.

8. A socket according to claim 1, wherein said socket is formed of a non-conductive high-impedance anti-static material.

9. A socket according to claim 8, wherein said non-conductive high-impedance anti-static material is selected from the group consisting of at least one of a plastic, a polymer and a resin.

10. A socket according to claim 1, wherein said socket is molded from a non-conductive high-impedance antistatic material.

11. A socket according to claim 10, wherein said non-conductive high-impedance anti-static material is selected from the group consisting of at least one of a plastic, a polymer and a resin.

12. A socket according to claim 1, wherein said body applies the force to the electrical component when said plurality of legs are attached to said board.

13. A socket according to claim 1, wherein said socket is formed of an elastic non-brittle material.

14. A socket according to claim 1, wherein said electrical component comprises an integrated circuit.

15. A socket according to claim 1, wherein said electrical component comprises a fine-pitched component.

16. A socket according to claim 1, wherein said body is shaped to uniformly contact with edges of said electrical component such that a uniform force is applied to each of said plurality of electrical leads.

17. A socket according to claim 1, wherein said plurality of pads comprise a plurality of electrical contact pads.

18. The socket of claim 1, wherein the electrical component includes four edges, said body including an inner ridge portion that uniformly contacts the four edges and a bottom portion that contacts the plurality of electrical leads.

19. The socket of claim 18, wherein the four edges form four electrical component corners, and wherein each of said four legs is positioned adjacent to one of the four electrical component corners when said legs are attached to the board.

* * * * *

UNITED STATES PATENT AND TRADEMARK OFFICE
CERTIFICATE OF CORRECTION

PATENT NO. : 5,779,488
DATED : 7/14/98
INVENTOR(S) : Cluff

It is certified that error appears in the above-identified patent and that said Letters Patent is hereby corrected as shown below:

Column 5, line 65, "boards;" should be --board;--

Signed and Sealed this

Twenty-second Day of June, 1999

Attest:

Q. TODD DICKINSON

*Attesting Officer*      *Acting Commissioner of Patents and Trademarks*